United States Patent
Shiu

(10) Patent No.: US 8,493,811 B2
(45) Date of Patent: Jul. 23, 2013

(54) MEMORY HAVING ASYNCHRONOUS READ WITH FAST READ OUTPUT

(75) Inventor: Shinye Shiu, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 588 days.

(21) Appl. No.: 12/703,446

(22) Filed: Feb. 10, 2010

(65) Prior Publication Data

US 2011/0194370 A1    Aug. 11, 2011

(51) Int. Cl.
*G11C 8/00*    (2006.01)

(52) U.S. Cl.
USPC ............... 365/230.06; 365/191; 365/230.03

(58) Field of Classification Search
USPC .......... 365/154, 156, 185.23, 189.15, 189.16, 365/191, 193, 230.05, 230.06, 2, 30.03, 233.1, 365/233.11
See application file for complete search history.

(56) References Cited

U.S. PATENT DOCUMENTS

| 5,473,574 | A | * | 12/1995 | Clemen et al. | 365/230.05 |
| 6,151,266 | A | * | 11/2000 | Henkels et al. | 365/230.06 |
| 6,639,866 | B2 | * | 10/2003 | Slamowitz et al. | 365/230.05 |
| 6,791,898 | B1 | * | 9/2004 | Manapat et al. | 365/233.11 |
| 7,251,175 | B2 | | 7/2007 | Slamowitz et al. | |
| 2008/0259698 | A1 | * | 10/2008 | Ozbek et al. | 365/189.14 |

OTHER PUBLICATIONS

Takamura, et al., "TITAC-2: An asynchronous 32-bit microprocessor based on Scalable-Delay-Insensitive model," 7 pages, Aug. 2002.
Fang, et al., "Non-Uniform Access Asynchronous Register Files," 11 pages, May 2004.

* cited by examiner

*Primary Examiner* — Kretelia Graham
(74) *Attorney, Agent, or Firm* — Meyertons, Hood, Kivlin, Kowert & Goetzel PC; Lawrence J. Merkel; Erik A. Heter

(57) ABSTRACT

A memory circuit is disclosed. The memory circuit includes memory cells and asynchronous read decode logic configured to decode a received address and to select particular ones of the memory cells for reading. The read decode logic may be comprised of static, combinational logic, and thus the decoding of the received address may be conducted without the use of a clock signal or a cycle of a clock signal. Accordingly, a read operation may be conducted responsive to receiving the read address, without waiting for a subsequent clock edge. Furthermore, read output logic may also be asynchronous, and thus may provide data read from the memory cells without having to wait for a clock edge. The read output logic may include push-pull driver circuits coupled to global bit lines. The push-pull driver circuits may drive their corresponding global bit lines based on the data read from corresponding memory cells.

15 Claims, 6 Drawing Sheets

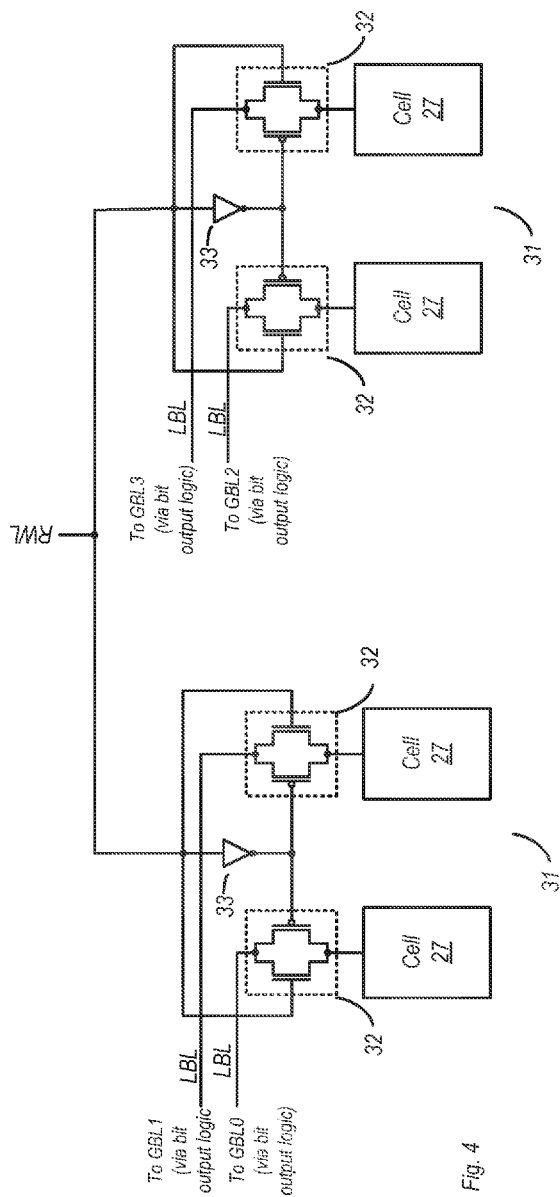
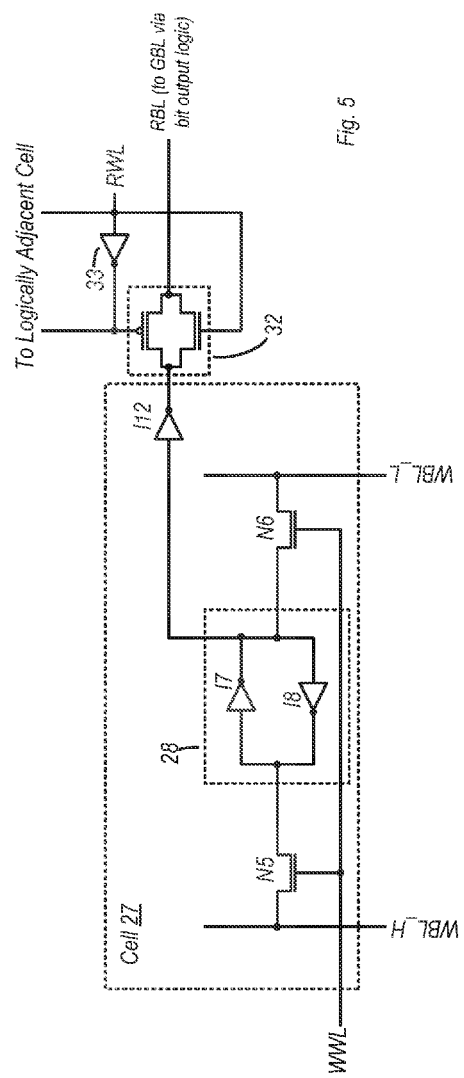
Fig. 4
Fig. 5

MEMORY HAVING ASYNCHRONOUS READ WITH FAST READ OUTPUT

BACKGROUND

1. Field of the Invention

This invention relates to electronic circuits, and more particularly, to memory circuits.

2. Description of the Related Art

Memory circuits are used in a wide variety of electronic system devices, from large, powerful computers to small, handheld devices. Types of memory circuits include static random access memory (SRAM), dynamic random access memory (DRAM), flash memory, and so on. Memory circuits may be implemented in various parts of a memory hierarchy, including as registers, as various levels of cache memories, Many memory circuits require the use of a clock signal to synchronize read and write operations. Such memory circuits may employ dynamic logic on read and write port inputs that operate according to the received clock signal. Precharge operations may be incorporated for write and/or read operations as well. However, some memory circuits may be configured to allow for asynchronous read operations, utilizing static logic for decoding read addresses.

FIG. 1 illustrates a memory circuit configured to enable asynchronous reads of a memory. In FIG. 1, memory 1 includes multiple cells 7, logically arranged in one or more 16×128 grids (for the sake of simplicity, only portions of memory circuit are shown).

Write operations are synchronized to a clock signal ('clk') received by write address logic 3 and write data logic 4. During a write operation, a write address (e.g., wad[0:n−1]) is conveyed from write address logic 3 (and more particularly to flop circuits, e.g., latches or flip flops, one of which is shown here, labeled 'SDC', for the sake of example), synchronous with an edge of the clock signal, to write address decode logic 6. Data to be written, wd[0:m−1], is conveyed to write data logic 4 (and more particularly to flop circuits, e.g., latches or flip flops, one of which is shown here for the sake of example). The output of write address decode logic activates a write word line ('WWL') corresponding to the address received. Concurrent with this operation, the data to be written is conveyed from write data logic 4 synchronous with the clock edge. Two complementary write bit lines ('wbl' and 'wbl_1') are coupled to receive the data from write data logic 4 and convey the data to a selected cell 7. The data is written into the selected cell 7 and retained by that cell 7 after the clock has transitioned on its next edge.

In contrast to the write operations described above, read operations in memory 1 do not require any synchronization with a clock signal. Instead, once the address (e.g., rad[0:1], rad[n−1:2], etc.) is received by read address logic 2 (which is static logic in this example), it is conveyed to read address decode logic 5, which then decodes the address and asserts a signal on the read word line ('rwl') if the address indicates that the cell(s) 7 coupled to that word line are selected. The bits from the selected cell(s) 7 then propagate to corresponding local bit lines ('lbl'), each of which includes a keeper 9 configured to hold the received logic value. Multiplexers 8 also receive select signals based on the received address. Thus, the bit received on the local bit lines from the selected cells propagate through the hierarchy of multiplexers 8, to a first global bit line ('gbl0'), to a second global bit line ('gbl1'), to a third global bit line ('gbl2'), and finally to signal line 'read_out' (via buffer 10 in this example).

SUMMARY

A memory circuit is disclosed. In one embodiment, the memory circuit includes memory cells and asynchronous read decode logic configured to decode a received address and to select particular ones of the memory cells for reading. The read decode logic may be include static, combinational logic, and thus the decoding of the received address may be conducted without the use of a clock signal or a cycle of a clock signal. Accordingly, a read operation may be conducted responsive to receiving the read address, without waiting for a subsequent clock edge. That is, read output logic may also be asynchronous. The read output logic may include push-pull driver circuits coupled to global bit lines. The push-pull driver circuits may drive their corresponding global bit lines based on the data read from corresponding memory cells.

In one embodiment, each of the memory cells may be coupled to a corresponding local bit line by a passgate circuit. When the passgate circuit is active, the logical value stored in the memory cell may be conveyed to the local bit line. The passgate circuit may be activated responsive to its corresponding memory cell being selected for reading by assertion of a word line coupled to that memory cell. The passgate circuits may be arranged in pairs associated with logically adjacent memory cells (e.g., for a given word, a passgate of a memory cell for bit position 0 may be paired with a passgate of a memory cell for bit position 1). The passgate circuits of a pair may share an inverter circuit that is coupled to the word line used to select the word in which the associated memory cells are included.

The memory may be implemented in various environments. In one embodiment, the memory may be implemented on an integrated circuit (IC), as a register file or other type of memory used by functional logic also implemented on the IC. In another embodiment, the memory may be implemented as a stand-alone memory in an electronic system.

BRIEF DESCRIPTION OF THE DRAWINGS

The following detailed description makes reference to the accompanying drawings, which are now briefly described.

FIG. 4 is a schematic diagram illustrating a memory cell arrangement for one embodiment of a memory circuit.

FIG. 5 is a schematic diagram of one embodiment of a memory cell.

Figure 1:
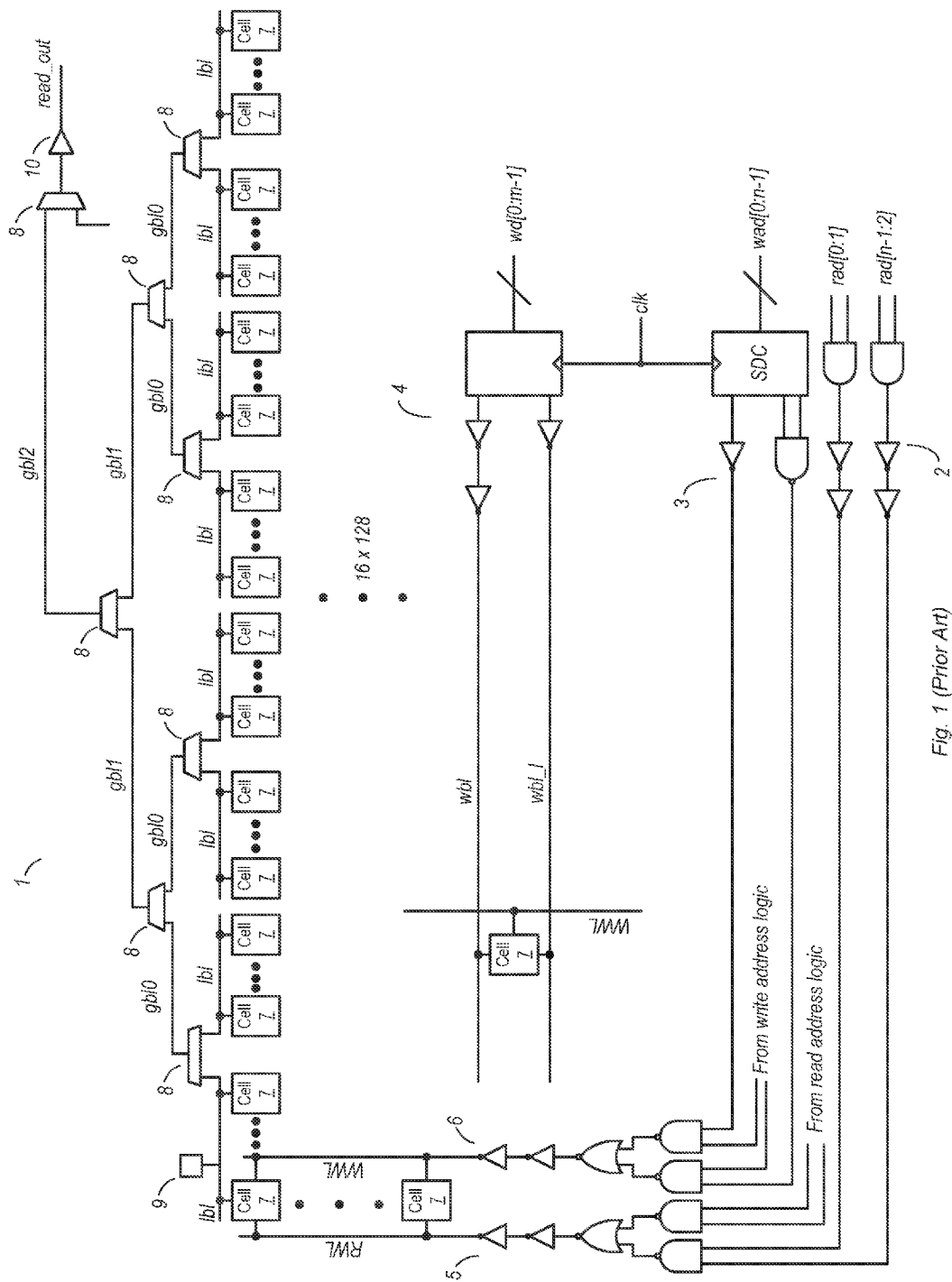
FIG. 1 is a block diagram of one embodiment of a memory circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 2:
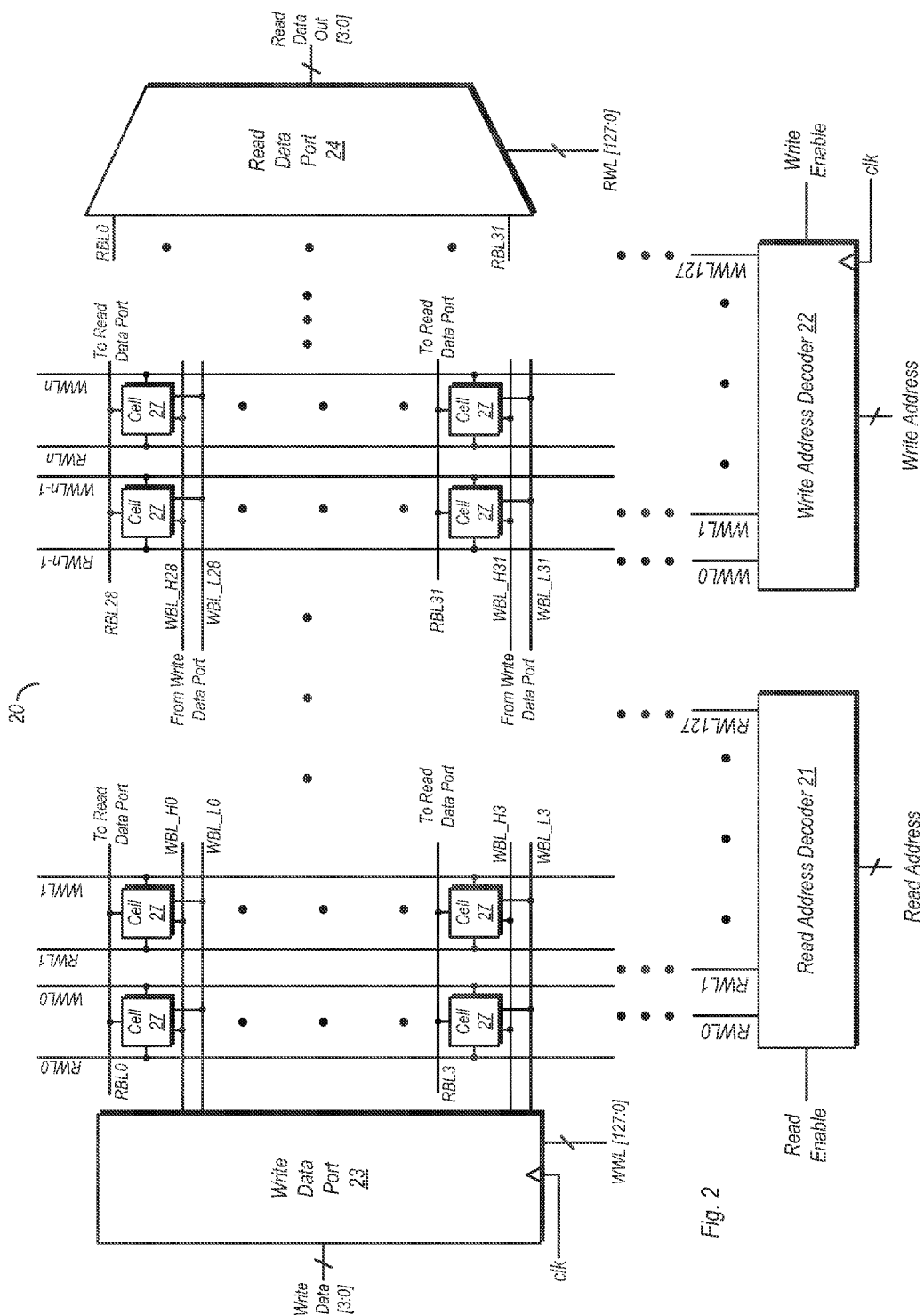
FIG. 2 is a block diagram illustrating one embodiment of a memory circuit.

Memory with Static Read and Dynamic Write:

Turning now to FIG. 2, a block diagram illustrating one embodiment of a memory circuit is shown. In the example shown, memory 20 illustrates various functional relationships between certain elements, with additional details to be provided of these elements to be provided in FIGS. 3, 4, and 5. It should be noted that the embodiments discussed herein are exemplary, and thus are not limiting in scope. Accordingly, a wide variety of embodiments that operate in accordance with the memory circuits to be discussed herein are possible and contemplated. In addition, it is noted that, for the sake of simplicity, not all elements of memory 20 are shown here.

In the embodiment shown, memory 20 includes a read address decoder 21, a write address decoder 22, a read data port 24, a write data port 23, and a set of cells 27 (sometimes referred to as 'memory cells' or 'bit cells'). While only one instance each of read address decoder 21, write address decoder 22, write data port 23, and read data port 24 are shown, multi-port embodiments of memory 20 are possible, and thus multiple instances of one or more of these elements may be present.

Both read address decoder 21 and write address decoder 22 are configured to decode received addresses, for reading from and writing to memory 20, respectively. In the embodiment shown, write address decoder 22 is coupled to receive a clock signal and configured to operate in accordance with a clock cycle of the clock signal. In contrast, read address decoder 21 in the embodiment shown is not configured to receive or utilize a clock signal during its operation. Instead, read address decoder 21 is configured for asynchronous operation, and may decode a read address upon its receipt, irrespective of a clock signal.

Read data port 24 may also be configured to operate asynchronously. Accordingly, memory 20 may be configured to perform read operations without regard to a clock signal. Read addresses may be decoded upon receipt by read address decoder 21, while read data port 24 may output data read from selected cells 27 as soon as the data is available.

In contrast to read operations, write operations in memory 20 may be performed synchronously. Thus, write address decoder 22 may, when the write enable signal is asserted, decode a received write address responsive to a clock signal edge. Similarly, write data port 23 may convey data to be written to selected ones of cells 27 responsive to a clock edge.

Since read address decoder 21 is configured to operate asynchronously, it may be substantially implemented using combinational logic circuitry. In one embodiment, read address decoder may be implemented as a 1 of N decoder, where N is the number of word lines. In this particular embodiment, read address decoder 21 is configured to assert one of 128 different word lines, depending on the received address. Other embodiments may include a greater or lesser number of word lines, depending on the number of words memory 20 is configured to store. Each word line may be coupled to a number of cells 27 that form a word. In this particular embodiment, the word size is 4 bits, however, other embodiments may utilize word sizes having a greater or lesser number of bits. When a word line is asserted by read address decoder 21, the cells 27 coupled thereto may be selected for reading. In the embodiment shown, the data stored in the selected ones of cells 27 may be conveyed to single ended read bit lines (e.g., 'RBL0', etc.), and thus to read data port 24. It is noted here that additional circuitry may be coupled between each cell 27 and its corresponding read bit line, and an example of such circuitry will be discussed below in reference to FIG. 4). Read address decoder 21 also includes an enable input ('Read Enable') in the embodiment shown. The address decoding operations described above may be performed when the read enable input is asserted. Read address decoder 21 may be inhibited from decoding an address if the read enable input is de-asserted.

Similar to read address decoder 21, read data port 24 may also be implemented using primarily combinational logic circuitry, although additional circuitry (e.g., driver circuits, as will be discussed below) may also be included. However, since read data port 24 is configured to operate independent of a clock signal, clocked circuits such as flip-flops, latches, and so forth may not be required for its implementation. Read data port 24 in the embodiment shown is coupled to each of the read bit lines and each of the read word lines. Based on the asserted read word line, read data port 24 is configured to convey the data received from the read bit lines associated with the selected cells 27 to the output lines, read data out [3:0]. Read data port 24 may include bit output logic circuitry and bank select circuitry that will be discussed in further detail with reference to FIG. 3.

Write address decoder 22 may include both combinational logic as well as clocked logic circuitry, which may include dynamic logic circuitry, flip-flops, latches, and so forth. For example, write address decoder 22 may include flip-flops having inputs coupled to receive the write address and outputs coupled to a 1 of N decoder. In another embodiment, a 1 of N decoder may be implemented using dynamic logic circuits coupled to receive the write address before or during a precharge phase and to decode the write address during the evaluation phase. Based on the address decoding operation, write address decoder 22 may assert one of the write word lines (WWL0, WWL1, etc.).

The assertion of a word line may enable selected cells 27 for receiving data to be written. In the embodiment shown, write data port 23 is coupled to each of cells 27 by a differential pair of write bit lines (e.g., WBL_H0, WBL_L0, etc.). Data to be written into selected ones of cells 27 may be received by write data port 23 via a data input, Write Data [3:0]. The write data may be conveyed from write data port 23 and written to the selected ones of cells 27 (as determined by the asserted one of the write word lines) via the differential write bit lines. Since write data port 23 is configured to operate according a cycle of a clock signal, write data may be conveyed upon arrival of a clock signal edge. Thus, whereas read operations in memory 20 may be performed asynchronously and independent of the clock signal, write operations in memory 20 may be synchronized to the clock signal.

Figure 3:
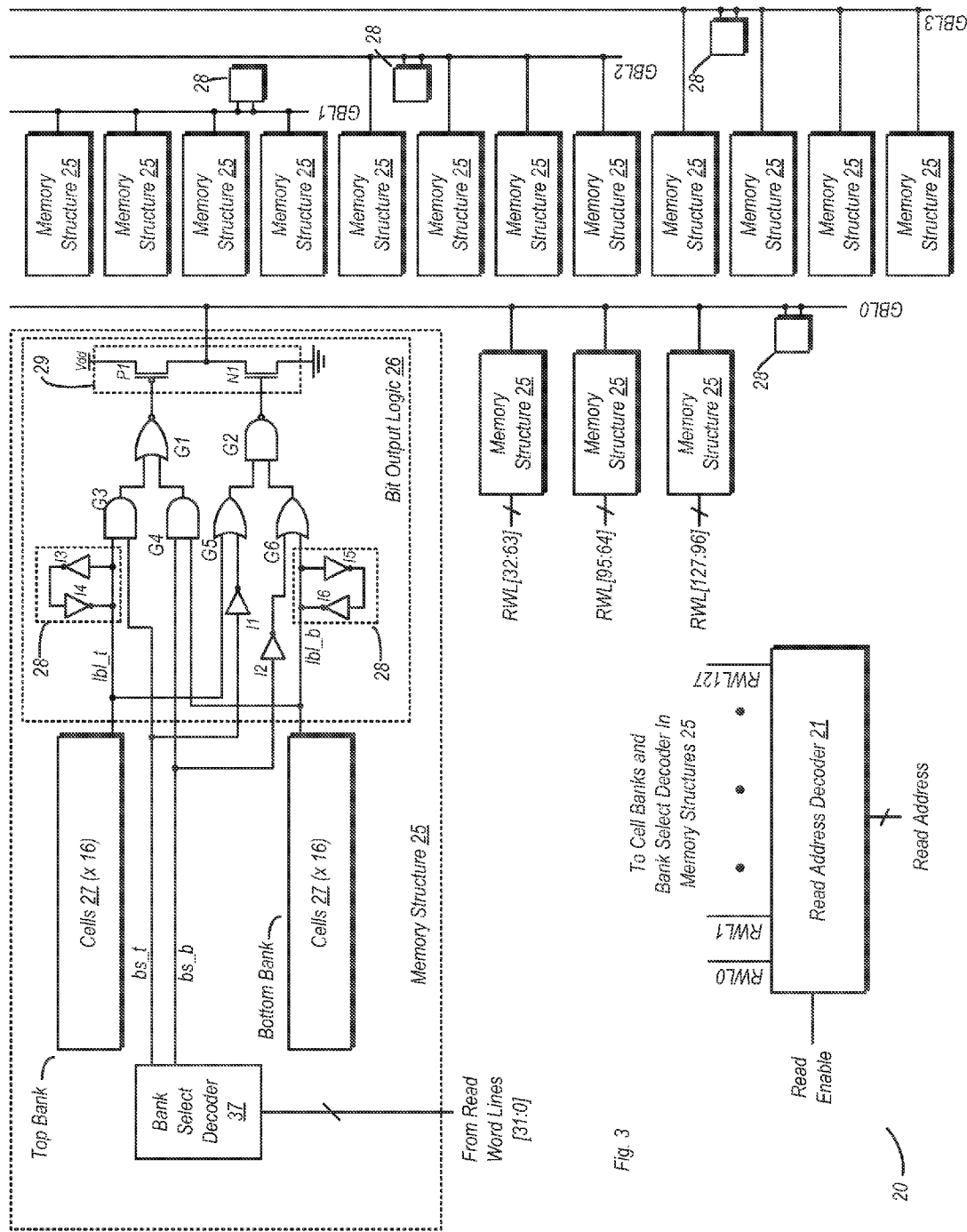
FIG. 3 is a diagram illustrating additional details of the read output circuitry for one embodiment of a memory circuit.

Memory with Bit Output Logic Illustrated:

FIG. 3 is a diagram illustrating additional details of one embodiment of memory circuit 20. More particularly, FIG. 3 illustrates additional details regarding one embodiment of the output logic used during read operations.

Memory 20 may be viewed as multiple memory structures 25, one of which is shown here in detail. Each of the memory structures 25 may be coupled to a global bit line (GBL1, GBL2, etc.), upon which the data may be conveyed as the result of a read operation. In this particular example, four different memory structures 25 are coupled to each global bit line. During a read operation, one memory structure 25 of each group of four may drive a data signal onto its corresponding global bit line, while the other memory structures coupled to that global bit line provide a tri-state output. Thus, for a given read address, one memory cell 27 in each group of four memory structures 25 may be selected for reading. It is noted that the arrangement shown here is exemplary, and other embodiments are possible and contemplated. Wile the arrangement shown in FIG. 3 is configured to output a 4-bit word, such an arrangement could be repeated multiple times to output larger words. For example, the arrangement shown in FIG. 3 could be repeated 8 times to output a 32-bit word. Furthermore, arrangements having a greater or lesser number of memory structures 25 coupled to each global bit line are also possible and contemplated.

Each memory structure 25 in the embodiment shown includes a top bank of cells 27 coupled to a first local bit line (lbl_t) and a bottom bank of cells 27 coupled to a second local bit line (lbl_b). Each bank includes 16 cells in this particular embodiment, although the size of the banks may vary from one embodiment to the next. Each memory structure 25 also includes a bank select decoder 37 coupled to receive inputs via word lines associated with the cells 27. In this particular example, bank select decoder may receive up to 32 word lines and may generate a first bank select signal (bs_t) if a cell 27 from the top bank is selected, and may generate a second bank select signal (bs_b) if a cell 27 from the bottom bank is selected. If no cells from either bank are selected, neither of the first or second bank select signals are asserted.

The local bit lines and bank select signals of each memory structure 25 may be received by a bit output logic unit 26. Referring momentarily back to FIG. 2, bit output logic 26 and bank select decoder 37 may be implemented in read data port 24, which may include a number of these particular units.

Bit output logic 26 includes a plurality of logic gates, G1-G6 and a push-pull driver circuit 29 comprising transistors P1 and N1. Logic gates G1, G3, and G4 in this embodiment form an AND-OR-Invert logic structure (G3 and G4 are AND gates, G1 is a NOR gate), with the output of gate G1 coupled to the gate terminal of transistor P1. When gate G1 drives a signal low on its output, transistor P1 may activate, thereby pulling the coupled global bit line (GBL0 in this example) up toward the supply voltage, Vdd. Logic gates G2, G5, and G6 in this embodiment form an OR-AND-Invert structure (gates G5 an G6 are OR gates, G2 is a NAND gate), with the output of gate G2 being coupled to the gate terminal of transistor N1. When a logic high is driven from the output of gate G2, transistor N1 may become active, thereby pulling the global bit line down toward a ground voltage.

The logic structure of bit output logic 26 also includes inverters I1 and I2, each of which is coupled to receive a bank select signal. The outputs of inverters I1 and I2 are coupled to inputs of logic gates G5 and G6, respectively, in this embodiment. The bank select signals bs_t and bs_b are also coupled to inputs of gates G3 and G4, respectively. Local bit line lbl_t in this embodiment is coupled to the input of gates G3 and G5, while local bit line lbl_b is coupled to the inputs of gates G4 and G6.

In this embodiment, the bank select signals are active high. If a cell 27 from the top bank is selected, bs_t will be driven high, while bs_b will remain low. If the selected cells conveys a logic high onto lbl_t, gate G3 will drive its output high, causing gate G1 to drive its output low and thus activate transistor P1. Gates G5 and G6 will drive their respective outputs high, causing gate G2 to drive its output low, thereby resulting in transistor N1 being held inactive. Thus, when bs_t and lbl_t are high, transistor P1 may pull GBL0 up toward the supply voltage Vdd.

If a selected cell 27 from the top bank conveys a low onto lbl_t, gate G5 outputs a low, and thus gate G2 outputs a high. The high output from gate G2 thus results in the activation of N1, and GBL0 is pulled low. The lows on lbl_t and bs_b also result in lows on the outputs of gates G2 and G4, which in turn results in a high output from gate G1 and thus to the gate terminal of transistor P1. Accordingly, transistor P1 is held inactive while transistor N1 pulls GBL0 low.

If a cell 27 from the bottom bank is selected, bank select decoder may drive bs_b high while holding bs_t low. If the selected cell 27 from the bottom bank conveys a high on local bit line lbl_b, gate G4 will drive its output high, thus resulting in a low on the output of gate G1. Accordingly, the low on the output of gate G1 results in the activation of transistor P1, and thus GBL0 is pulled high. The high on lbl_b and low on bs_t (which is inverted to a high by inverter I1) results in highs on the outputs of gates G5 and G6. The highs on the outputs of G5 and G6 result in gate G2 driving the gate terminal of transistor N1 low and thus holding it inactive.

When a selected cell 27 from the bottom bank conveys a low onto lbl_b, gate G6 receives a first low input from lbl_b and a second low input from the output of inverter I2 (which inverts the high of bs_b). Thus, gate G6 outputs a low in this situation, thereby causing gate G2 to drive a high onto the gate terminal of transistor N1. As a result, transistor N1 is activated and pulls GBL0 low. The low on lbl_b also causes gate G4 to output a low, while the low on bs_t causes gate G3 to output a low. With both of its inputs low, gate G1 outputs a high to the gate terminal of transistor P1, thereby holding it inactive.

If no cell 27 from either the top or bottom banks is selected, bank select decoder 37 outputs lows on both bs_t and bs_b. The lows on bs_t and bs_b are received as inputs by gates G3 and G4, respectively, thus causing gate G1 to receive lows on both of its inputs. Gate G1 therefore outputs a high, and transistor P1 is held inactive. As a result of the lows on both bs_t and bs_b, inverters I1 and I2 output highs to corresponding inputs of gates G5 and G6, respectively. This results in highs on both inputs of gate G2, which outputs a low as a result. The low output by gate G2 results in a low in the gate terminal of transistor N1, which is thus held inactive. Accordingly, when bank select decoder 37 outputs lows onto both bs_t and bs_b, both transistors P1 and N1 of that particular bit output logic unit 26 are held inactive, and thus that particular memory structure 25 does not drive the corresponding global bit line. In an embodiment, the output structure illustrated in FIG. 3 may provide data output responsive to a read address rapidly, e.g. comparable to a dynamic read port, while still using the asynchronous static read port.

In the embodiment shown, local bit lines lbl_t and lbl_b each are coupled to a keeper 28. Keeper 28 coupled to lbl_t includes inverters I3 and I4, while keeper 28 coupled to lbl_b includes inverters I5 and I6. These keepers 28 may hold the local bit line at its most recently read state even after the corresponding cell 27 is no longer selected. In addition, each global bit line in this embodiment is also coupled to a corresponding keeper 28 to hold its state subsequent to the completion of the read operation. Other embodiments may not include the keeper 28 on the local bit lines.

Each of memory structures 25 in the embodiment shown (and thus their corresponding bit output logic units 26) may function in the manner described above. As previously noted, the memory structures 25 are coupled by groups to a corresponding global bit line, with groups of four memory structures 25 coupled to each global bit line in this particular example. In the embodiment shown, read address decoder 21 is configured to assert one of 128 word lines, whereas each memory structure 25 is coupled to receive 32 word lines. Each of the 128 word lines output by read address decoder 21 is provided to one memory structure 25 within a given group coupled to the same global bit line. Within a particular group of memory structures 25, only one cell 27 of that group may be selected for a given read address, and thus only one push-pull driver circuit 29 drives a corresponding global bit line during any given read operation. This may in turn prevent any contention issues arising from two different push-pull drivers 29 from attempting to drive the same global bit line at the same time.

While the memory structures 25 have been described above according to a particular arrangement, other embodiments are possible and contemplated. For example, embodiments of a memory structure 25 having more than two banks of cells 27, and thus a different logic arrangement in bit output logic cell 26 are possible and contemplated. Furthermore, arrangements wherein a greater or lesser number of memory structures 25 are coupled to a particular global bit line are also possible. The arrangement of such memory structures 25 and their coupling to their respective global bit lines may be such that no more than one push-pull driver 29 drives a global bit line for any given read operation.

Cell Arrangement and Structure:

FIGS. 4 and 5 illustrate the arrangement and structure of cells 27 for one embodiment of memory 20. Other arrangements and cells structures may be implemented in other embodiments.

FIG. 4 is a schematic diagram illustrating an arrangement of cells 27 for one embodiment of a memory circuit 20. In the embodiment shown, cells 27 are arranged into cell pairs 31. Furthermore, each of cells 27 is coupled to a corresponding pass-gate 32, which is in turn coupled to a corresponding local bit line ('LBL'). When pass-gates 32 are active, cells 27 are transparent to their corresponding local bit lines. When active, passgates 32 may enable the data stored in each cell 27 to be conveyed via its local bit line to bit output logic (such as that discussed above) and eventually to corresponding ones of the global bit lines for output from the memory. In the arrangement of the embodiment shown in FIG. 4, each of cells 27 stores one bit of a four-bit word although other word widths may be used in various embodiments. Thus, the cells and their corresponding passgates are arranged as shown in this embodiment into logically adjacent pairs. When pass-gates 32 are active, a local bit line coupled to first cell 27 (via a corresponding passgate 32) may convey a bit destined for GBL0, a local bit line coupled to a second cell 27 may convey a bit destined for GBL1, a local bit line coupled to a third cell 27 may convey a bit destined for GBL2, and a local bit line coupled to a fourth cell 27 may convey a bit destined for GBL3. The cells 27 shown in this drawing may thus each belong to a separate memory structure 25 as discussed above with reference to FIG. 3.

Since each of the cells 27 shown in FIG. 4 store a bit associated with the same word, the same word line may activate each of the corresponding passgates 32. Furthermore, in this example, passgates 32 associated with the logically adjacent pairs of cells 27 may share an inverter 33. The shared inverter 33 may have an output coupled to the gate terminal of the P-channel transistor of the passgate, while the non-inverted portion of the word line may be coupled to the gate terminal of the N-channel transistor of each passgate. When the word line is asserted, each inverter 33 may provide a low to the two P-channel transistors to which it is coupled. Since the gate of the N-channel transistor of each passgate 32 receives the non-inverted word line, each passgate 32 may become fully active responsive to the inverters 33 driving a low to the P-channel transistors of the coupled passgate pair. Utilizing inverters 33 in a shared configuration as shown in FIG. 4 may save circuit area and conserve power relative to an embodiment in which one inverter is provided for each passgate.

Turning now to FIG. 5, a schematic diagram of one embodiment of a cell 27 is shown. Cell 27 in this embodiment includes a keeper 28 (which includes inverters I7 and I8) which may store both true and complementary values of a bit. A write to cell 27 may be accomplished by asserting the write word line (WWL). When the write word line is asserted, transistors N5 and N6 may become active. When transistors N5 and N6 are active, a true data value may be conveyed to keeper 28 from the true write bit line, WBL_H, while a complementary data value may be conveyed to keeper 28 from the complementary write bit line, WBL_L. After the write word line falls low again, the logic values provided from the true and complementary write bit lines may be stored in keeper 28.

A read of cell 27 may be accomplished by activating the passgate 32 to which it is coupled. As noted above, the activation of the passgate 32 may be accomplished by assertion of the corresponding read word line. In this particular embodiment, when the read word line is asserted, the logic value stored on the complementary node of keeper 28 in cell 27 may be inverted by inverter I12 and driven to the read bit line (RBL) through the active passgate 32. The read operation may be terminated by de-assertion of the read word line.

It is noted that cell 27 shown in FIG. 5 is one of many possible embodiments of a storage cell that may be used in various embodiments of memory circuit 20. Other types of memory cells, including those having a greater or lesser number of transistors or other circuits are possible and contemplated. Similarly, the arrangement shown in FIG. 4 is also exemplary, as various embodiments of memory circuit 20 may arrange storage cells in a variety of different ways.

Figure 6:
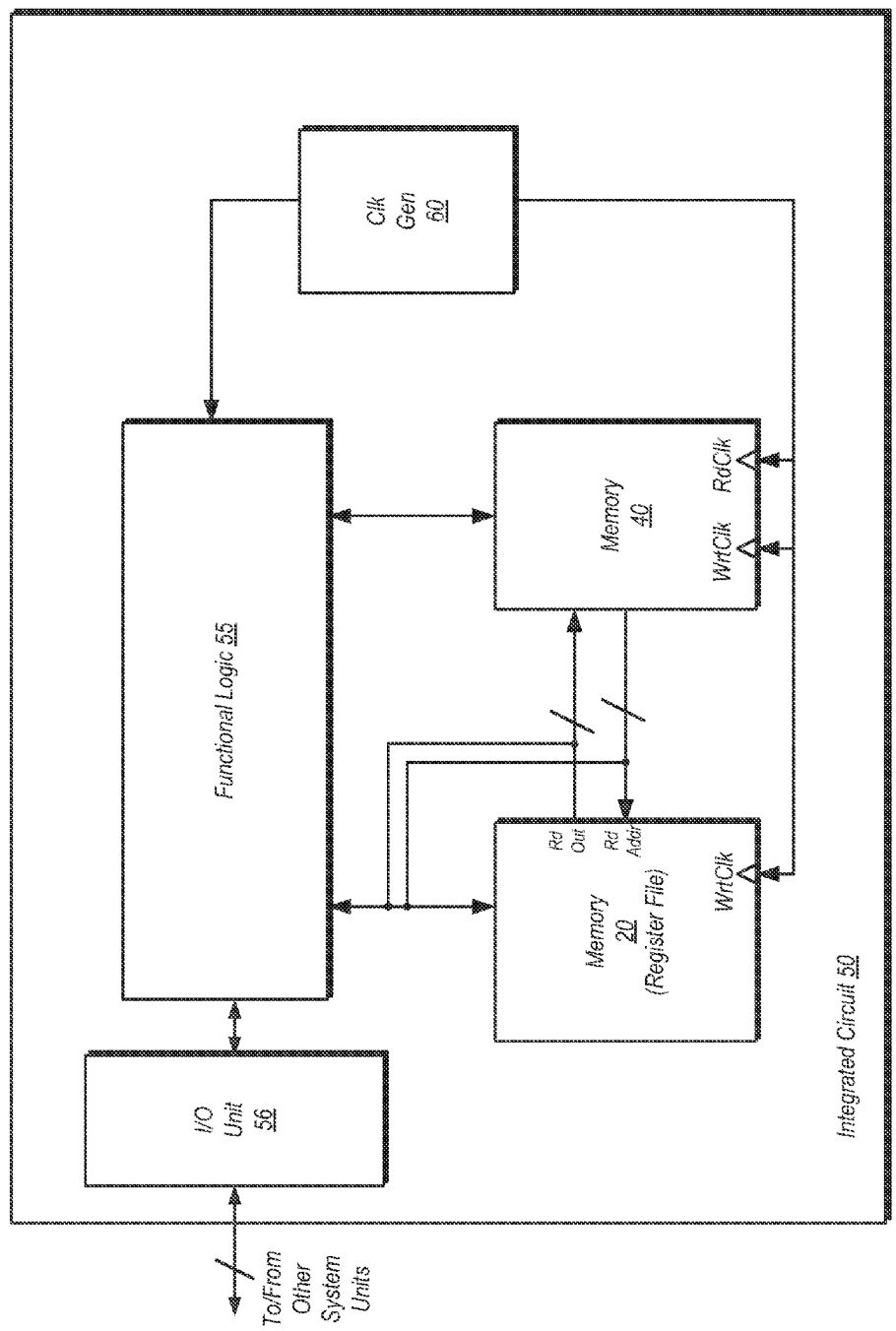
FIG. 6 is a block diagram of one embodiment of an integrated circuit.

Integrated Circuit:

FIG. 6 is a block diagram of one embodiment of an integrated circuit (IC) 50 that includes an embodiment of memory circuit 20 implemented as a register file. It is noted however that embodiments of memory circuit 20 may be implemented as other types of memory as well, including various levels of cache memory, random access memory (RAM), or any other type of memory to which it may be suited. IC 50 also includes memory circuit 40, which is coupled to provide information to memory circuit 20.

In the embodiment shown, memory array 20 is coupled to functional logic 55, which is configured to perform the various functions of IC 50. Functional logic 55 may in turn be coupled to input/output (I/O) unit 56, which provide an interface to system units external to IC 50. Also included in IC 50 is a clock generation circuit 60, which is configured to provide clock signals to functional logic 55, memory circuit 40, and memory circuit 20.

Memory circuit 40 in the embodiment shown is configured to perform synchronous reads and synchronous writes, and thus is configured to receive the clock signal at a read clock input (RdClk) and a write clock input (WrtClk). In contrast, memory circuit 20 is configured to perform asynchronous reads, as described above, while performing asynchronous writes. Therefore, memory circuit 20 includes a write clock input but no read clock input. Moreover, memory circuit 20 in this embodiment may receive address information on a read address input (RdAddr) from either memory circuit 40 or functional unit 55. Since memory circuit 20 is configured to perform asynchronous reads, a read operation may begin as soon as the address is received at the read address input, without waiting for the edge of a clock signal. Similarly, the data read from memory circuit 20 may be provided on its read output port (RdOut) as soon as it is available, also without regard to a clock signal. This may in turn improve the performance of IC 50, as read operations from the register file implemented by memory circuit 20 may be performed faster than they might otherwise be if such operations were performed synchronous with a clock signal.

It is noted that IC 50 in the embodiment shown is exemplary, and thus other embodiments of an IC 50 utilizing an embodiment of memory circuit 20 are possible and contemplated. Types of devices which utilize embodiments of memory circuit 20 at one or more locations and/or memory types include, but are not limited to, general purpose processors, ASICs (application specific integrated circuits), digital signal processors, and so forth.

Figure 7:
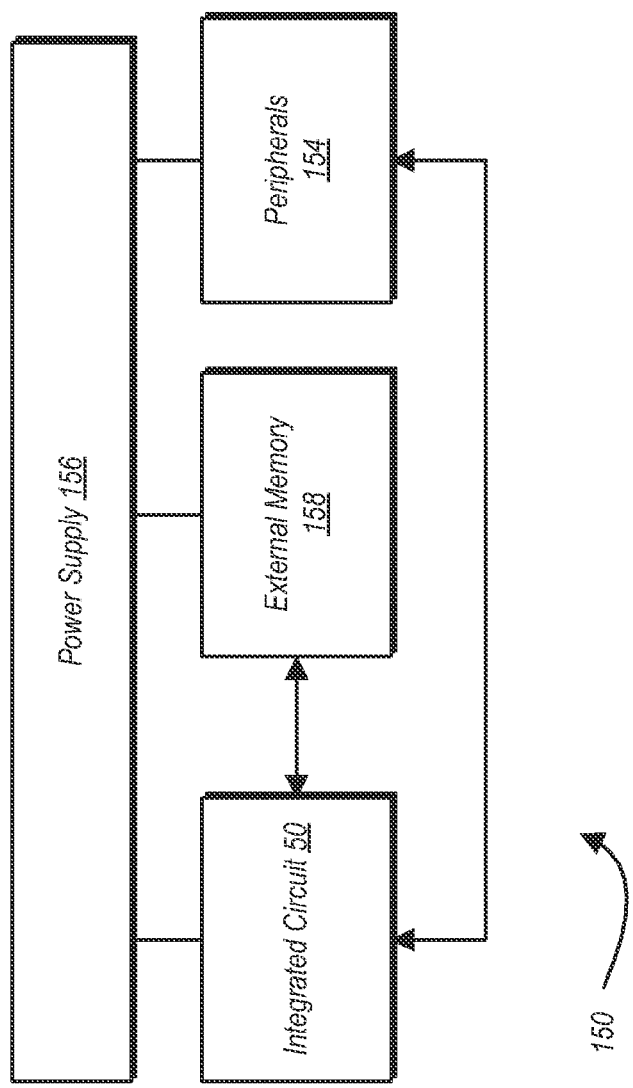
FIG. 7 is a block diagram of one embodiment of an electronic system.

Exemplary System:

Turning next to FIG. 7, a block diagram of one embodiment of a system 150 is shown. In the illustrated embodiment, the system 150 includes at least one instance of an IC 50 (from FIG. 5) coupled to one or more peripherals 154 and an external memory 158. IC 50 may thus include on or more embodiments of a memory circuit 20 implemented thereon. A power supply 156 is also provided which supplies the supply voltages to the IC 50 as well as one or more supply voltages to the memory 158 and/or the peripherals 154. In some embodiments, more than one instance of the IC 50 may be included (and more than one external memory 158 may be included as well).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc. Furthermore, external memory 158 may include one or more memory arrays therein, including one or more instances of an embodiment of memory array 20 as described above.

Numerous variations and modifications will become apparent to those skilled in the art once the above disclosure is fully appreciated. It is intended that the following claims be interpreted to embrace all such variations and modifications.

What is claimed is:

1. A memory comprising:
    an address input coupled to receive a read address for the memory;
    a static decoder coupled to receive the read address and configured to decode the address to activate a plurality of word lines to access memory cells of the memory, wherein the read address decodes to activate a first word line of the plurality of word lines; and
    a static output circuit coupled to the memory cells and configured to output data from the memory cells that are accessed via the first word line, the static output circuit comprising a plurality of push-pull driver circuits coupled to each of a plurality of global bit lines;
    wherein a read of the memory is performed in response to the read address arriving at the address input and flows through the static decoder and static output circuit independent of a clock defining a clock cycle in which the memory operates during use, and wherein the read of the memory occurs at any point in the clock cycle in response to the read address during use;
    wherein the memory cells are organized into pairs having first and second memory cells, wherein each of the first and second memory cells are coupled to first and second passgates, respectively, and wherein the memory further comprises a shared inverter coupled between and to each of the first and second passgates and having an input coupled to one of the plurality of word lines, and wherein the first and second passgates are configured to activate responsive to assertion of the word line coupled to the input of the shared inverter.

2. The memory as recited in claim 1, wherein the first and second passgates are coupled to first and second local bit lines, respectively, and wherein the first and second passgates are configured to, when active, couple the first and second memory cells, respectively, to the first and second local bit lines.

3. The memory as recited in claim 2, wherein each of the first and second local bit lines are coupled to a keeper circuit, wherein the keeper circuit coupled to each of the first and second local bit lines is shared by one or more additional memory cells coupled to respective ones of the first and second local bit lines, wherein the first and second local bit lines are coupled to the static output circuit.

4. A register file comprising:
    a plurality of storage cells, wherein each of the plurality of storage cells is coupled to a respective one of plurality of word lines, wherein each of the plurality of storage cells is coupled to a corresponding passgate circuit that is further coupled to a respective one of a plurality of local bit lines, and wherein storage cells coupled to a particular one of the plurality of word lines are arranged into logically adjacent pairs of storage cells, and wherein the register file further includes an inverter shared between corresponding passgate circuits of the logically adjacent pairs of storage cells;
    read address logic coupled to receive a read address, wherein the read address logic is configured to, responsive to receiving a read address, activate one or more of the plurality of word lines in order to select the storage cells coupled thereto for reading;
    a plurality of output circuits each coupled to receive data from selected ones of the plurality of storage cells, wherein the each of the plurality of output circuits is coupled to a corresponding one of a plurality of global bit lines by a respective push-pull driver circuit;
    wherein the read address logic is configured to decode a read address independent of a clock signal, and wherein each the plurality of output circuits is configured to output data to its corresponding one of the plurality of global bit lines independent of the clock signal.

5. The register file as recited in claim 4, wherein the inverter includes an input coupled to the particular one of the plurality of word lines and an output coupled to corresponding passgate circuits associated with particular ones of the plurality of storage cells, and wherein each of the corresponding passgate circuits is configured to become active responsive to the assertion of the particular one of the plurality of word lines.

6. The register file as recited in claim 4, wherein the register file further includes write address decode logic, wherein the write address decode logic is configured to decode a write address synchronous with a clock signal.

7. The register file as recited in claim 6, wherein the register file further includes a write data input port, wherein the write data input port is configured to convey data to be written into selected storage cells synchronous with a clock signal.

8. A memory comprising:
an address decoder coupled to receive a read address and configured to decode the read address and to activate selected ones of a plurality of word lines responsive to receiving the read address, wherein the address decoder is configured to decode the address and activate the selected word lines independent of a clock signal; and
a plurality of memory structures arranged into groups, wherein each memory structure of each group is coupled to a corresponding one of a plurality of global bit lines, wherein each memory structure includes:
first and second banks of bit cells coupled to first and second local bit lines, respectively, wherein each of the bit cells is coupled to a corresponding passgate circuit, and wherein a first bit cell in a first group of the memory structures is coupled to a passgate associated with a second bit cell in a second group of the memory structures, wherein the passgate coupled to the first bit cell and the passgate coupled to the second bit cell share an inverter having an input coupled to a word line associated with each of the first and second bit cells;
a bit output unit coupled to the first and second local bit lines, the bit output unit including static logic circuitry and a push-pull driver coupled to the corresponding one of the global bit lines, wherein the static logic circuitry is configured to cause the push-pull driver to drive the corresponding global bit line responsive to the activation of a word line coupled to a bit cell of one of the first bank or second bank.

9. The memory as recited in claim 8, wherein each of the passgate circuits associated with the first bit cell and the second bit cell are configured to activate responsive to assertion of the word line associated with each of the first and second bit cells, and wherein the first and second bit cells are each coupled to a corresponding local bit line when the passgate circuits associated with the first bit cell and the second bit cell are active.

10. The memory as recited in claim 8, wherein each of the plurality of word lines is coupled to one bit cell in each of the groups of memory structures.

11. The memory as recited in claim 8, wherein the push-pull driver includes a first transistor coupled between a voltage supply node and a corresponding global bit line and a second transistor coupled between the corresponding global bit line and a ground node, wherein the static logic circuitry is further configured to:

cause the push-pull driver to drive the corresponding global bit line high if a selected bit cell in one of the first or second banks causes a high to be driven on the first or second local bit line;
cause the push-pull driver to drive the corresponding global bit line low if a selected bit cell of one of the first and second banks causes a low to be driven on the first or second bit line;
cause both first and second transistors to be inactive if no bit cells of either the first or second banks are selected.

12. A system comprising:
an integrated circuit;
a memory coupled to the integrated circuit, wherein the memory includes:
a read address decoder coupled to receive a read address from the integrated circuit and configured to decode the read address, wherein the read address decoder comprises static logic configured to operate independent of clock cycle defined by a clock signal, and wherein the read address decoder is configured to assert a selected one of a plurality of word lines based on decoding the received address;
a plurality of memory cells, the plurality of memory cells including selected memory cells coupled to the selected word line;
a data output circuit coupled to the plurality of memory cells and configured to drive data received from the selected memory cells onto a plurality of global bit lines, wherein the data output circuit includes a plurality of push-pull driver circuits each coupled to a corresponding one of the global bit lines, and wherein the data output circuit is configured to operate independent of the clock cycle; and
a plurality of passgates, wherein each of the plurality of passgates is coupled to a corresponding one of the plurality of memory cells and a corresponding one of a plurality of bit lines, and wherein passgates associated with logically adjacent memory cells share an inverter having an input coupled to a corresponding one of the plurality of word lines.

13. The system as recited in claim 12, wherein the passgates associated with logically adjacent memory cells are configured to activate responsive to assertion of the corresponding one of the plurality of word lines coupled to the input of the inverter.

14. The system as recited in claim 12, wherein each of the push-pull driver circuits includes a pull-up transistor configured to activate responsive to a logic high conveyed from a selected memory cell and a pull-down transistor configured to activate responsive to a logic low conveyed from the selected memory cell.

15. The system as recited in claim 14 further comprising read output logic, wherein the read-output logic is configured to inhibit the pull-up and pull-down transistors of particular ones of the push-pull driver circuits if no memory cell corresponding to the particular ones of the push-pull driver circuits are selected for reading.

* * * * *